US010663491B2

(12) United States Patent
Ye et al.

(10) Patent No.: US 10,663,491 B2
(45) Date of Patent: May 26, 2020

(54) VOLTAGE-CURRENT PROBE FOR MEASURING RADIO-FREQUENCY ELECTRICAL POWER IN A HIGH-TEMPERATURE ENVIRONMENT AND METHOD OF CALIBRATING THE SAME

(71) Applicant: Applied Materials, Inc., Santa Clara, CA (US)

(72) Inventors: Zheng John Ye, Santa Clara, CA (US); Jay D. Pinson, II, San Jose, CA (US); Juan Carlos Rocha, San Carlos, CA (US); Abdul Aziz Khaja, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/893,173

(22) Filed: Feb. 9, 2018

(65) Prior Publication Data
US 2018/0231587 A1    Aug. 16, 2018

Related U.S. Application Data

(60) Provisional application No. 62/460,060, filed on Feb. 16, 2017.

(51) Int. Cl.
C23C 16/52 (2006.01)
C23C 16/50 (2006.01)
(Continued)

(52) U.S. Cl.
CPC ............ *G01R 15/181* (2013.01); *C23C 16/50* (2013.01); *C23C 16/505* (2013.01); *C23C 16/52* (2013.01);
(Continued)

(58) Field of Classification Search
None
See application file for complete search history.

(56) References Cited

U.S. PATENT DOCUMENTS 5,565,737 A * 10/1996 Keane ................. H05H 1/0081
315/111.21
6,677,711 B2 * 1/2004 MacGearailt ..... H01J 37/32082
118/723 R
(Continued)

OTHER PUBLICATIONS

International Search Report issued to PCT/US2018/015252 dated May 4, 2018.
(Continued)

*Primary Examiner* — Binu Thomas
(74) *Attorney, Agent, or Firm* — Patterson + Sheridan LLP (57) ABSTRACT

A voltage-current sensor enables more accurate measurement of the voltage, current, and phase of RF power that is delivered to high-temperature processing region. The sensor includes a planar body comprised of a non-organic, electrically insulative material, a measurement opening formed in the planar body, a voltage pickup disposed around the measurement opening, and a current pickup disposed around the measurement opening. Because of the planar configuration and material composition of the sensor, the sensor can be disposed proximate to or in contact with a high-temperature surface of a plasma processing chamber.

8 Claims, 6 Drawing Sheets

(51) Int. Cl.
  *H01J 37/32* (2006.01)
  *G01R 15/14* (2006.01)
  *G01R 15/18* (2006.01)
  *C23F 4/00* (2006.01)
  *C23C 16/505* (2006.01)
  *G01R 15/16* (2006.01)
  *H01L 21/67* (2006.01)

(52) U.S. Cl.
  CPC .............. *C23F 4/00* (2013.01); *G01R 15/142* (2013.01); *G01R 15/144* (2013.01); *G01R 15/16* (2013.01); *H01J 37/3299* (2013.01); *H01J 37/32174* (2013.01); *H01J 37/32477* (2013.01); *H01J 37/32559* (2013.01); *H01J 37/32935* (2013.01); *H01J 37/32082* (2013.01); *H01L 21/67069* (2013.01)

(56) References Cited

U.S. PATENT DOCUMENTS

| | | | | |
|---|---|---|---|---|
| 2011/0285412 A1* | 11/2011 | Ibuki | ................... | G01R 15/142 |
| | | | | 324/686 |
| 2012/0013352 A1* | 1/2012 | Choueiry | ............ | H04B 17/318 |
| | | | | 324/629 |
| 2012/0223697 A1 | 9/2012 | Lee et al. | | |
| 2014/0049250 A1* | 2/2014 | Brown | ................. | G01R 15/181 |
| | | | | 324/127 |
| 2014/0302256 A1* | 10/2014 | Chen | ................. | H01J 37/32715 |
| | | | | 118/500 |
| 2014/0346952 A1 | 11/2014 | Choi | | |
| 2014/0367042 A1 | 12/2014 | Keil et al. | | |
| 2015/0136325 A1* | 5/2015 | Ye | ..................... | H01J 37/32091 |
| | | | | 156/345.28 |
| 2015/0357210 A1 | 12/2015 | Mori et al. | | |
| 2015/0382442 A1 | 12/2015 | Mueller et al. | | |
| 2016/0091534 A1 | 3/2016 | Emma et al. | | |
| 2017/0004955 A1 | 1/2017 | Leeser | | |
| 2017/0032935 A1 | 2/2017 | Benjamin et al. | | |

OTHER PUBLICATIONS

International Search Report/ Written Opinion issued in PCT/US2018/015103 dated Jun. 5, 2018.

* cited by examiner

VOLTAGE-CURRENT PROBE FOR MEASURING RADIO-FREQUENCY ELECTRICAL POWER IN A HIGH-TEMPERATURE ENVIRONMENT AND METHOD OF CALIBRATING THE SAME

CROSS-REFERENCE TO RELATED APPLICATIONS

This application claims priority to U.S. Provisional Patent Application Ser. No. 62/460,060 filed on Feb. 16, 2017, which herein is incorporated by reference.

BACKGROUND

Field

Embodiments described herein generally relate to radio-frequency (RF) plasma-processing systems and, more particularly, to a voltage-current probe for measuring RF electrical power in a high-temperature environment and a method of calibrating the same.

Description of the Related Art

In a radio frequency (RF) system, which includes an RF power source, a transmission line and a load, power transfer over the transmission line can be maximized by matching the transmission line impedance to both the source impedance and the load impedance. If these impedances are not closely matched, RF power provided by the RF power source is reflected back towards the RF power source in the form of standing waves in the transmission line. As a result, maximum RF power cannot be transmitted to the load, and the reflected power is effectively lost, where the amount of power lost due to reflection is generally a function of the mismatch between the source and load impedances.

It is conventional to reduce reflected loss by incorporating an impedance-matching system or apparatus between an RF power source and the load. However, in RF plasma processing chambers, there is typically still a significant impedance mismatch between the RF power source and the plasma chamber, due to non-linearities in the chamber. Thus, not all output power provided by the RF power source typically reaches the processing region of an RF plasma processing chamber. In addition, losses in the transmission line and in the impedance matching system itself further reduce output power that actually reaches the processing region of an RF plasma processing chamber.

Consequently, to quantify RF power during a particular etching or deposition process in the chamber, and to better control the process, a voltage-current (V/I) probe is sometimes employed to measure the voltage and current of RF energy entering the processing region of an RF plasma processing chamber.

Ideally, a V/I probe is located proximate the power input point on the plasma processing chamber, since accurate measurement of voltage and current at any point along the RF transmission line can be highly location dependent. Specifically, the presence of standing waves in the RF transmission line, caused by reflection, results in the peak voltage and peak current varying with location along the transmission line. However, in high-temperature applications, conventional V/I probes are not compatible with being located on the plasma chamber. For instance, a typical plasma-enhanced chemical vapor deposition (PECVD) chamber can have a process temperature on the order of 600° C.-700° C., and the chamber body can reach temperatures on the order of 100° C.-200° C. By contrast, conventional V/I probes, which are generally formed with organic material-containing substrates, such as FR-4, can thermally degrade at temperatures greater than about 70° C. Therefore, for high-temperature applications, V/I probes are typically located some distance from the process chamber, which greatly reduces the accuracy of voltage and current measurements provided to the impedance-matching system and/or the RF power source. Conventional V/I type probe configurations that position the measuring elements within the RF matching device and/or RF power supply are also prone to signal-to-noise ratio problems. Also, the measured RF values versus actual delivered RF power signal for a conventional V/I probe can vary from chamber to chamber based on the position of probe to other external components, which can all prevent the conventional V/I probe from being able to detect small variations in the RF power or phase provided to a processing chamber.

Accordingly, there is a need in the art for systems and methods that facilitate more accurate measurement of voltage and current employed in an RF plasma processing system.

SUMMARY

One or more embodiments described herein provide a voltage-current probe for measuring radio-frequency electrical power in a high-temperature environment and a method of calibrating the same.

In one embodiment, a voltage-current sensor assembly includes a planar body comprised of a non-organic, electrically insulative material, a measurement opening formed in the planar body, a voltage pickup disposed around the measurement opening, wherein the voltage pickup is electrically coupled to a first voltage measurement circuit, and a current pickup disposed around the measurement opening, wherein the current pickup is electrically coupled to a first current measurement circuit.

In another embodiment, a plasma processing chamber includes a chamber body, a discharge electrode disposed within the chamber body, a voltage-current sensor that is mounted to an atmospheric surface of the chamber body and comprises a planar body comprised of a non-organic, electrically insulative material, wherein the voltage-current sensor includes a first voltage measurement circuit and a second current measurement circuit, and a radio-frequency transmission line that is fed through a measurement opening of the voltage-current sensor and electrically couples radio frequency power to the discharge electrode.

In another embodiment, a non-transitory computer-readable medium stores instructions that, when executed by a processor, cause the processor to perform the steps of: causing RF power to be generated at a first magnitude and transmitted to a plasma processing chamber via a transmission line fed through a measurement opening formed in a planar body of a sensor; receiving a first voltage signal from a voltage pickup disposed around the measurement opening and a second voltage signal from a current pickup disposed around the measurement opening, wherein the first voltage signal and the second voltage signal are generated in response to the RF power being transmitted via the transmission line; determining an actual RF power coupled to the plasma processing chamber, based on the first voltage signal, the second voltage signal, a first calibration coefficient that is applied to the first voltage signal, and a second calibration coefficient that is applied to the second voltage signal, wherein the first calibration coefficient is based on a third voltage signal from the voltage pickup that is generated in response to RF power at a second magnitude being transmitted via the transmission line to a dummy load that is matched to the transmission line, and the second calibration coefficient is based on a fourth voltage signal from the current pickup that is generated in response to the RF power at the second magnitude being transmitted via the transmission line to the dummy load; determining that the actual RF power coupled to the plasma processing chamber is outside a predetermined range of a target RF power; and responsive to determining the actual RF power is outside the predetermined range, causing RF power to be generated at a third magnitude and transmitted to the plasma processing chamber via the transmission line.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Figure 1:
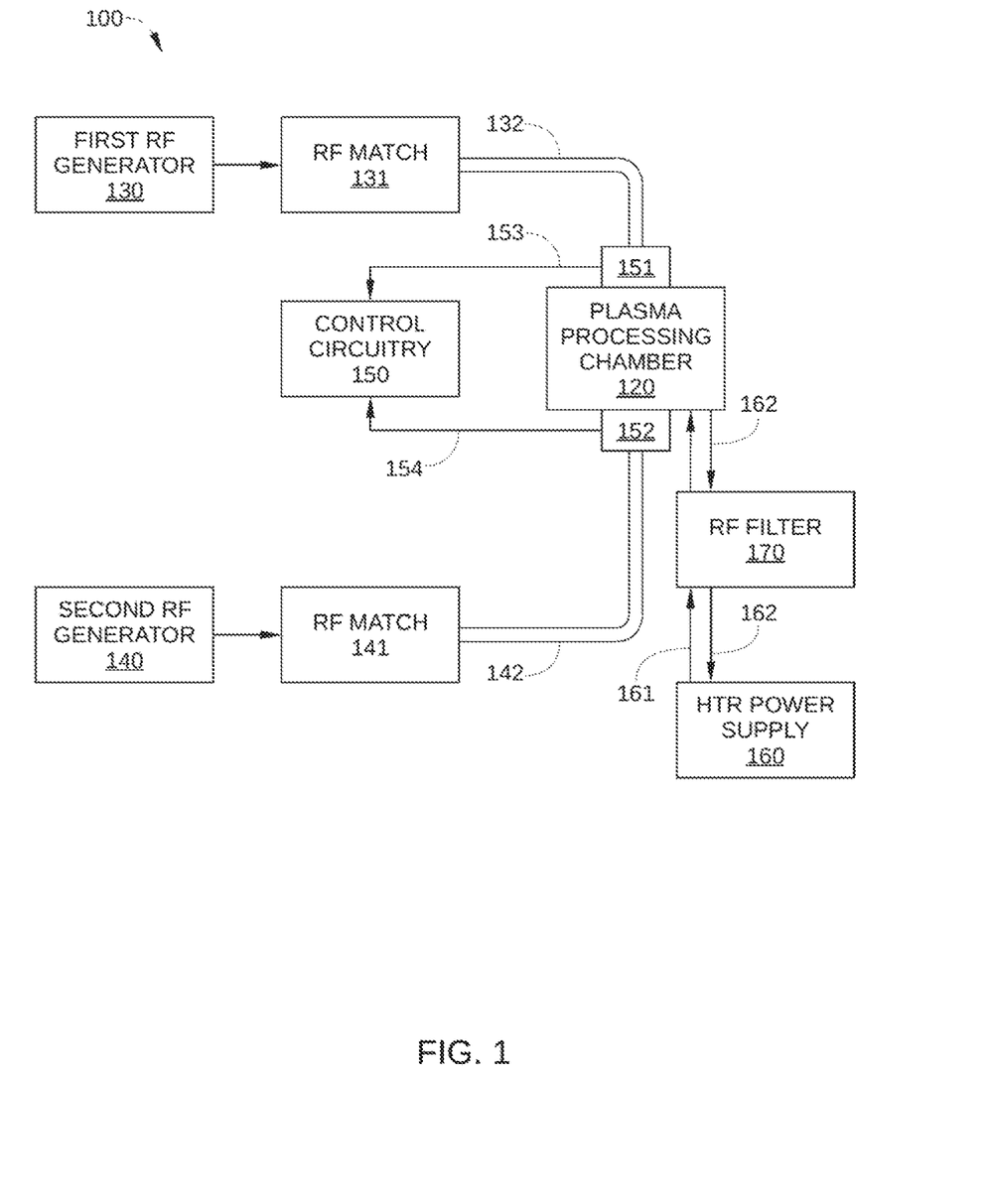
FIG. 1 is a block diagram illustrating a radio-frequency (RF) plasma processing system, according to various embodiments of the disclosure.

FIG. 1 is a block diagram illustrating a radio-frequency (RF) plasma system 100, according to one or more aspects of the invention. RF plasma system 100 includes a plasma processing chamber 120, a first RF generator 130 coupled to plasma processing chamber 120 via a first RF match 131 and a transmission line 132, and a second RF generator 140 coupled to plasma processing chamber 120 via a second RF match 141 and a transmission line 142. RF plasma system 100 further includes a control circuitry 150 (also referred to herein as "controller 150") and voltage-current (V/I) sensors 151 and 152.

Plasma processing chamber 120 may be any technically feasible plasma deposition or etch chamber that includes a capacitively coupled plasma system or an inductively coupled plasma system for generating plasma therein, including a plasma-enhanced chemical vapor deposition (PECVD) system, a physical vapor deposition system, an epitaxial layer deposition system, a plasma etch system, and the like. First RF generator 130 may be any technically feasible RF power generator configured to provide RF power to one or more discharge electrodes of plasma processing chamber 120 and thereby drive plasma generation in plasma processing chamber 120. First RF generator 130 may provide the RF power at one RF frequency, or at multiple RF frequencies. For example, in some embodiments, first RF generator 130 may be configured to supply power at an RF frequency of 13.56 MHz to a distribution manifold (also referred to as a showerhead) or other component suitable for use as a discharge electrode in plasma processing chamber 120. Similarly, second RF generator 140 may be any technically feasible RF power generator configured to drive plasma generation in plasma processing chamber 120 at one RF frequency, or at multiple RF frequencies. For example, in some embodiments, second RF generator 140 may be configured to supply power at a lower RF frequency of 360 kHz, or the like, to a substrate support (also referred to as a susceptor) or other component suitable for use as a discharge electrode in plasma processing chamber 120.

As shown, first RF generator 130 transmits RF power, i.e., power through first RF match 131 and transmission line 132, to an RF load in plasma processing chamber 120. V/I sensor 151 enables measurement of the current, voltage, and phase of the RF power, by transmitting to control circuitry 150, via signal leads 153, a voltage induced by a voltage associated with the RF power and a voltage induced by a current associated with the RF power. Because V/I sensor 151 is disposed at the transmission line 132 connection point 221, 222 positioned on an external surface of plasma processing chamber 120 or proximate thereto, correction for the effects of standing wave components in the transmission line 132 by control circuitry 150 is generally not necessary. Similarly, second RF generator 140 transmits RF power, through second RF match 141 and transmission line 142, to an RF load in plasma processing chamber 120. V/I sensor 152 enables measurement of the current, voltage, and phase of RF power coupled to plasma processing chamber 120 via transmission line 142. Specifically, V/I sensor 152 transmits to control circuitry 150, via signal leads 154, a voltage induced by a voltage associated with the RF power and a voltage induced by a current associated with the RF power. Because V/I sensor 152 is disposed at the transmission line 142 connection point 247 positioned on an external surface of plasma processing chamber 120 or proximate thereto, correction for the effects of standing wave components in transmission line 142 by control circuitry 150 is generally not necessary.

In embodiments in which plasma processing chamber 120 is configured with a pedestal or substrate support heater, RF plasma system 100 further includes a heater power supply 160 coupled to heating elements (not shown in FIG. 1) in plasma processing chamber 120 via conductive leads 161 and 162. In such embodiments, RF plasma system 100 also includes an RF filter 170 that is electrically disposed between the heating elements in plasma processing chamber 120 and heater power supply 160. While heating elements disposed within a pedestal or substrate support are not nominally part of the RF system of plasma processing chamber 120, such heater elements typically include coiled conductive components that have many windings, and consequently can couple to the RF energy provided within the processing region (not shown in FIG. 1) of the plasma processing chamber 120. Thus, RE filter 170 is an electronic system or apparatus that is configured to provide a portion of a conductive path formed between the heater coils and the heater power supply 160, while protecting heater power supply 160 from the RF energy provided within the plasma processing chamber 120. RF filter 170 is typically disposed proximate to or in contact with an external, i.e., atmospheric, surface of plasma processing chamber 120. As a result, RF filter 170 can reach temperatures of 100° C.-200° C. during operation of plasma processing chamber 120. In such embodiments, V/I sensor 152 may be disposed on a surface within an enclosure that houses the RF filter 170 to maximize or otherwise increase proximity of V/I sensor 152 to plasma processing chamber 120. Alternatively, V/I sensor 152 may be disposed between RF filter 170 and a surface of plasma processing chamber 120.

Control circuitry 150 includes logic configured to receive signals from V/I sensor 151 and determine a current, a voltage, a phase, and a magnitude of the coupled RF power entering plasma processing chamber 120 via transmission lines 132. In some embodiments, such logic is implemented as magnitude and phase detection circuitry. In embodiments in which first RF generator 130 transmits RF power via transmission lines 132 to multiple connection points 221, 222 within plasma processing chamber 120, control circuitry 150 includes logic configured to receive multiple signals from V/I sensor 151, and thereby determine a current, a voltage, a phase, and a magnitude of the coupled RF power entering plasma processing chamber 120 via each such transmission lines 132. Similarly, control circuitry 150 includes logic configured to receive signals from V/I sensor 152 and determine a current, a voltage, a phase, and a magnitude of the coupled RF power entering plasma processing chamber 120 via transmission lines 142.

In embodiments in which plasma processing chamber 120 is configured with a pedestal or substrate support heater, V/I sensor 152 is configured to transmit to control circuitry 150 via signal leads 154 a signal voltage induced by RF power passing through conductive leads 161 and 162 from heater elements within the pedestal or substrate support heater. V/I sensor 152 is further configured to transmit to control circuitry 150, via signal leads 154, a voltage signal induced from a flow of current associated with a portion of the RF power provided to the pedestal, which passes through the conductive leads 161 and 162 to an external ground (not shown). In such embodiments, control circuitry 150 is further configured to determine a current, a voltage, a phase, and a magnitude of the RF power passing through conductive leads 161 and 162 based on the voltages transmitted via signal leads 154. Thus, RF power lost via conductive leads 161 and 162 and heater power supply 160 can be quantified based on the current and voltage measurements provided by the V/I sensor 152. Consequently, instance-to-instance variation in the electrical behavior of the electrical circuit containing the RF filter 170 (i.e., from one chamber to the next) can be quantified and compensated for, thereby preventing chamber-to-chamber variation in processes performed in various instances of plasma processing chamber 120. For example, in such embodiments, a process performed in plasma processing chamber 120 may be based on the actual or close to actual RF power delivered via transmission lines 142 to the processing region 285 of the process chamber, due to the correction for the RF power lost via conductive leads 161 and 162, rather than just the measurement of the RF power provided by second RF generator 140.

In some embodiments, the V/I sensor 152 is positioned within a region of the processing chamber, such as region 285 within the substrate support, that is at least partially surrounded by grounded or shielded process chamber elements (e.g., heater bellow, heater's central shaft) to isolate the V/I sensor 152 components from various external noise sources. In some configurations, a minimum fixed gap (e.g., 1-10 mm) is maintained between all of the V/I sensor 152 components and components that enclose the region 285 of the processing chamber in which the V/I sensor is placed. Consequently, instance-to-instance variation in the electrical measurements provided by the V/I sensor 152 will be reduced, thereby preventing chamber-to-chamber variation in processes performed in various instances of plasma processing chamber 120. In one example, a V/I sensor 152A and/or 152B is disposed within an internal region 285 of the susceptor 208.

In the embodiment illustrated in FIG. 1, a single controller 150 is depicted in RF plasma system 100. In other embodiments, a different controller 150 may be incorporated into each RF generator included in RF plasma system 100. In other embodiments, the functionality of control circuitry 150 may be incorporated into a central system controller for the RF plasma system 100. In either case, the functionality of control circuitry 150 may include any technically feasible implementation, including via software, hardware, and/or firmware.

Figure 2:
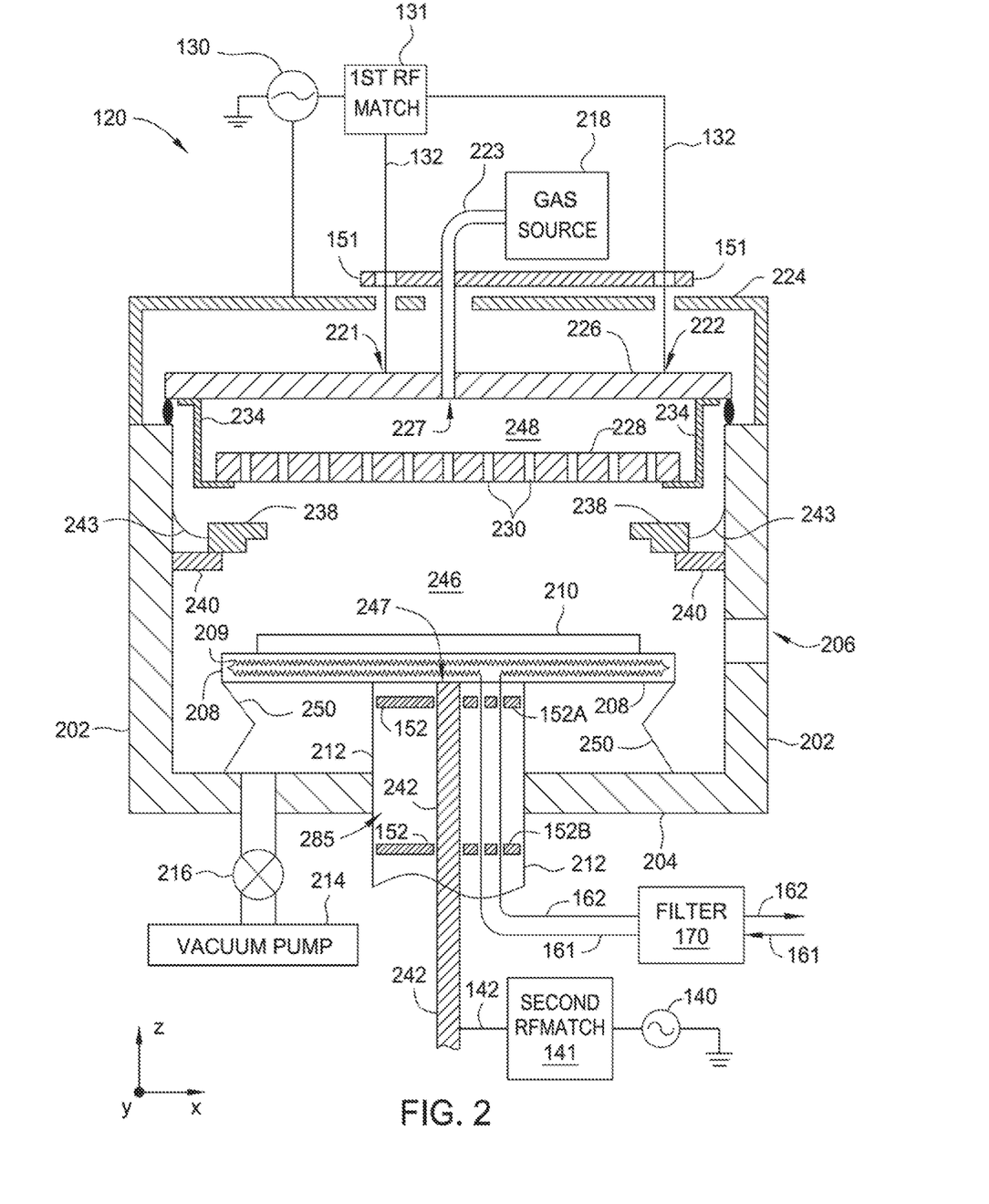
FIG. 2 is a schematic cross sectional view of a plasma processing chamber of the RF plasma processing system in FIG. 1, configured according to various embodiments of the disclosure.

FIG. 2 is a schematic cross sectional view of plasma processing chamber 120 configured according to various embodiments of the disclosure. By way of example, the embodiment of plasma processing chamber 120 in FIG. 2 is described in terms of a PECVD system, but any other plasma processing chamber may fall within the scope of the embodiments, including other plasma deposition chambers or plasma etch chambers. Plasma processing chamber 120 includes walls 202, a bottom 204, and a chamber lid 224 that together enclose a susceptor 208 and a processing region 246. Plasma processing chamber 120 further includes a vacuum pump 214, a gas source 218, first RF generator 130 and first RF match 131, second RF generator 140 and second RF match 141, and RF filter 170, each coupled externally to the plasma processing chamber 120.

In addition, plasma processing chamber 120 includes one or more V/I sensors 151 and 152 directly coupled to or otherwise mounted on an atmospheric surface of plasma processing chamber 120. In the embodiment illustrated in FIG. 2, plasma processing chamber 120 includes V/I sensor 151 coupled to or otherwise mounted on an upper surface thereof, so that voltage and current passing through transmission line(s) 132 can be accurately measured proximate processing region 246 and a substrate 210. In addition, plasma processing chamber 120 includes V/I sensor 152 coupled to or otherwise mounted on a lower surface thereof, so that voltage and current passing through transmission lines 142 can be accurately measured proximate processing region 246 and substrate 210. In some embodiments, V/I sensor 152 is mounted on or near bottom 204 of plasma processing chamber 120, or is coupled directly to bottom 204 of plasma processing chamber 120. Alternatively, V/I sensor 152 may be mounted in an atmospheric region 246 within plasma processing chamber 120, such as within a bellows 250 coupled to the susceptor 208 that is moveable. In such embodiments, V/I sensor 152 may be coupled directly to a surface of the susceptor 208. Alternatively, V/I sensor 152 may be mounted to susceptor 208 via a bracket or other support structure. In either case, V/I sensor 152 is disposed within a few centimeters of substrate 210 and processing region 246. In some configurations, the V/I sensor 152, such as V/I sensor 152A, is disposed within a few centimeters of a connection point 247 formed at an interface between a metal rod 242 that is coupled to a conductive portion of the susceptor 208 (e.g., electrode or electrode connection). Positioning the V/I sensor 152 at, or at least within a few centimeters of, a connection point 247 can be helpful since this point will typically be a node (e.g., a point along a standing wave where the wave has minimum amplitude) within a portion of the transmission lines 142.

It is noted that V/I sensors 151 and 152 are not disposed within plasma processing chamber 120, and instead may be coupled directly to a surface thereof that is exposed to atmosphere during processing of substrate 210. Alternatively or additionally, V/I sensors 151 and 152 may be mounted to a bracket or other support structure that is coupled directly to such an atmospheric surface of plasma processing chamber 120.

Walls 202 and bottom 204 may comprise an electrically conductive material, such as aluminum or stainless steel. Disposed in plasma processing chamber 120 is a shadow frame 238 that is configured to prevent or reduce unwanted deposition from occurring on surfaces of susceptor 208 that are not covered by substrate 210 during processing. Shadow frame 238 rests on a ledge 240 when plasma processing chamber 120 is idle, and may be coupled by one or more straps 243 to an inside surface of walls 202. Through one or more of walls 202, a slit valve opening 206 may be present that is configured to facilitate insertion of substrate 210 into and removal of substrate 210 from plasma processing chamber 120. A slit valve configured to seal slit valve opening 206 may be disposed either inside or outside of plasma processing chamber 120. For clarity, a slit valve is not shown in FIG. 2.

Vacuum pump 214 is coupled to plasma processing chamber 120 and is configured to adjust the vacuum level therein. As shown, a valve 216 may be coupled between plasma processing chamber 120 and vacuum pump 214. Vacuum pump 214 evacuates plasma processing chamber 120 prior to substrate processing and removes process gas therefrom during processing through valve 216. Valve 216 may be adjustable to facilitate regulation of the evacuation rate of plasma processing chamber 120. The evacuation rate through valve 216 and the incoming gas flow rate from gas source 218 determine chamber pressure and process gas residency time in plasma processing chamber 120.

Susceptor 208 may include any technically feasible apparatus for supporting a substrate 210 during processing by plasma processing chamber 120, such as substrate 210 in FIG. 2. In some embodiments, susceptor 208 is disposed on a shaft 212 that is configured to raise and lower susceptor 208. In one embodiment, shaft 212 and susceptor 208 may be formed at least in part from or contain an electrically conductive material, such as tungsten, copper, molybdenum, aluminum or stainless steel. In embodiments in which plasma processing chamber 120 is a capacitively coupled plasma chamber, susceptor 208 may be configured to contain an electrode (not shown). In such embodiments, a metal rod 242 is electrically coupled to an embedded electrode disposed within the susceptor 208 and is configured to provide RF power to the embedded electrode through the connection point 247. As such, the embedded electrode and metal rod 242 are electrically coupled to the second RF generator 140 via transmission lines 142.

In some embodiments, susceptor 208 includes one or more heating elements 209 for heating substrate 210 during processing. In such embodiments, heating elements 209 are coupled to heater power supply 160 via conductive leads 161 and 162, which may be disposed within shaft 212. Conductive leads 161 and 162 each pass through a respective measurement opening (not shown in FIG. 1) of V/I sensor 152, so that RF current and voltage can be measured thereby.

Gas source 218 is coupled to plasma processing chamber 120 via a tube 223 that passes through chamber lid 224. Tube 223 is coupled to a backing plate 226 to permit processing gas to pass through the backing plate 226 and enter a plenum 248 between backing plate 226 and a gas distribution showerhead 228. Gas distribution showerhead 228 may be held in place adjacent to backing plate 226 by a suspension 234, so that gas distribution showerhead 228, backing plate 226, and suspension 234 together form an assembly sometimes referred to as a gas box. Thus, during operation, processing gas introduced into plasma processing chamber 120 from gas source 218 fills plenum 248 and then passes through gas passages 230 formed in gas distribution showerhead 228 to uniformly enter processing region 246. In alternative embodiments, process gas may be introduced into processing region 246 via inlets and/or nozzles (not shown) that are attached to walls 202 in addition to or in lieu of gas distribution showerhead 228.

First RF generator 130 is coupled to backing plate 226 at coupling points 221 and 222 via one or more transmission lines 132. Thus, coupling points 221 and 222 act as RF power feed points to backing plate 226. Alternatively, first RF generator 130 may be coupled to backing plate 226 at a single coupling point. Transmission lines 132 may include coaxial cables and, in some embodiments, are configured with additional shielding external to these coaxial cables to prevent excessive leakage of RF power to ground. In one embodiment, first RF generator 130 includes an RF generator capable of generating RF currents at a frequency of about 13.56 MHz. In another embodiment, first RF generator 130 includes a VHF generator capable of generating VHF power, such as VHF power at frequencies between about 40 MHz to 200 MHz or more. As shown, transmission lines 132 each pass through a respective measurement opening of V/I sensor 151.

In some embodiments, first RF generator 130 provides high frequency power through first RF match 131 to a discharge electrode disposed adjacent processing region 246. Such a discharge electrode may include a process gas distribution element, such as gas distribution showerhead 228 (as shown in FIG. 2), or an array of gas injection nozzles, through which process gases are introduced into processing region 246. The discharge electrode, e.g., gas distribution showerhead 228, may be oriented substantially parallel to the surface of substrate 210, and capacitively couples plasma source power into processing region 246, which is disposed between substrate 210 and gas distribution showerhead 228. During processing, susceptor 208, shadow frame 238 and substrate 210 are raised and positioned near the lower surface of showerhead 228 (e.g., within 1-30 mm) to form the at least partially enclosed processing region 246.

In some embodiments, plasma processing chamber 120 may also include a machine-compatible controller (e.g., control circuitry 150) configured to control the operation of plasma processing chamber 120, including output power level of first RF generator 130, flow rate of the various process gases directed to processing region 246 via gas source 218, adjustment of valve 216, etc. Generally such a controller includes one or more processors, memory, and instructions suitable for controlling the operation of plasma processing chamber 120. Alternatively, in some embodiments, a system controller configured to control operation of a multi-chamber processing system may instead be configured to control the operation of plasma processing chamber 120, as well as one or more other processing chambers.

Plasma processing, such as a PECVD process, is generally performed in the plasma processing chamber 120 by placing substrate 210 on susceptor 208 and introducing one or more precursor gases from gas source 218 into processing region 246. The precursor gas or gases in processing region 246 are energized (e.g., excited) into a plasma state by applying RF power to gas distribution showerhead 228 via coupling points 221 and 222, and/or applying RF power to susceptor 208. This type of plasma is typically referred to as capacitively coupled plasma (CCP) since the electron heating mechanism is predominately through the capacitive plasma sheaths near gas distribution showerhead 228 and a grounded electrode, such as, for example, the susceptor 208 or walls 202. The excited gas reacts to form a layer of material on a surface of substrate 210.

Generally, RF current seeks the shortest path to return to the source driving it. Therefore, during plasma processing a driven RF current travels from first RF generator 130, through the plasma generated in the processing region 246, and then to an RF return path, such as walls 202. In embodiments in which susceptor 208 is coupled to second RF generator 140, RF current travels from second RF generator 140 through the rod 242, embedded electrode, and plasma disposed in the processing region 246, and then to an RF return path, such as walls 202 and bottom 204. However, in embodiments in which susceptor 208 includes heating elements 209, heating elements 209 may couple to the RF energy delivered to the plasma processing chamber 120, and some fraction of RF energy provided to susceptor 208 may not return to second RF generator 140. Instead, a portion of the RF energy provided by second RF generator 140 may flow to heater power supply 160 via conductive leads 161 and 162. While filter 170 is configured to reduce the flow of RF energy along conductive leads 161 and 162, the efficiency of filter 170 is rarely perfect. As a result, a significant portion of RF energy may flow to heater power supply 160 despite the presence of filter 170. Thus, in addition to power loss due to reflection, RF power loss through conductive leads 161 and 162 can also impact the magnitude of RF energy that is actually delivered to processing region 246. Moreover, because filter 170 performance typically varies from instance to instance, the impact of RF power loss through conductive leads 161 and 162 can vary in each instance of plasma processing chamber 120. Thus, when nominally identical processes are performed in two different instances of plasma processing chamber 120, process results, such as film thickness, uniformity, and the like, can suffer unpredictable variation, unless the RF power actually delivered to processing region 246 can be measured accurately.

Conventional V/I sensors for RF applications generally include organic substrates that can be thermally damaged at 70° C. or more, such as FR-4. As a result, for high-temperature applications, such as PECVD chambers, conventional V/I sensors are typically located some distance from the processing chamber. Consequently, measurements made by such sensors and used by the RF matching components in the electrical circuit rely on extrapolation techniques to compensate for the location dependence of RF measurements made a distance from the processing chamber along an imperfectly matched transmission lines due to this induced error in the sensed electrical measurements. Such extrapolations are highly dependent on the structural details of plasma processing chamber 120, and are very difficult to verify experimentally, and even when verified for one process, typically change for other processes according to process chemistry and chamber operating conditions. Further, due to the non-linear nature of the standing wave present in transmission lines 132 and 142, conventional extrapolation techniques based on an idealized transmission lines model cannot accurately account for the RF power loss sustained between substrate 210 and a remote measurement point, and therefore can greatly underestimate or overestimate such power loss.

According to embodiments, V/I sensors 151 and/or 152 enable more accurate measurement of the voltage, current, and phase of RF power that is delivered to processing region 246. Specifically, V/I sensors 151 and/or 152 are configured for a high-temperature environment, and therefore are compatible for placement proximate plasma processing chamber 120, even when a high-temperature process is performed therewith. One such embodiment is illustrated in FIGS. 3A and 3B.

Figure 3A:
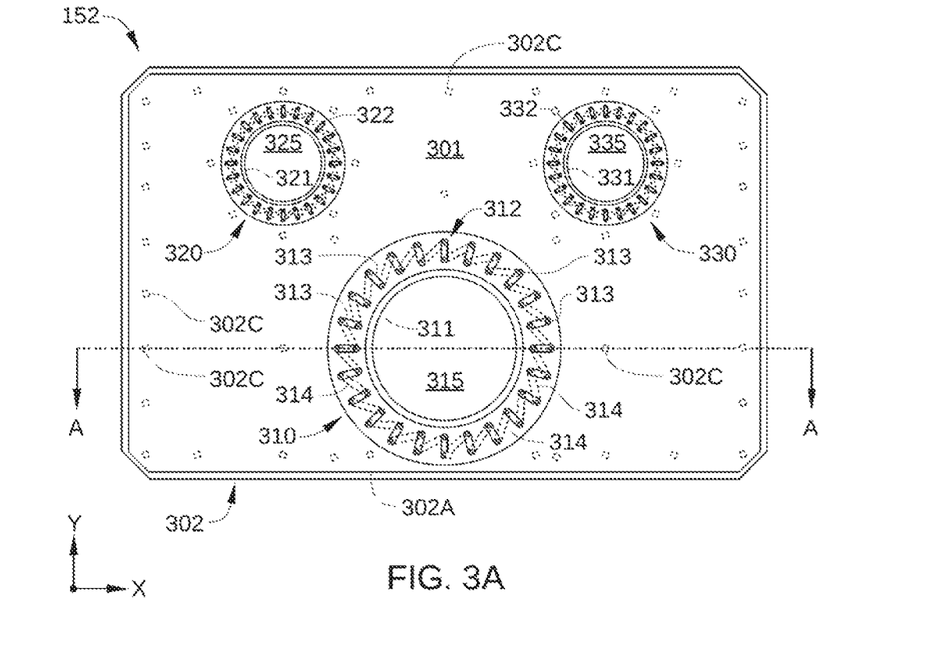
FIG. 3A is a schematic plan view of a V/I sensor in the RF plasma processing system in FIG. 1, according to various embodiments of the disclosure.
Figure 3B:
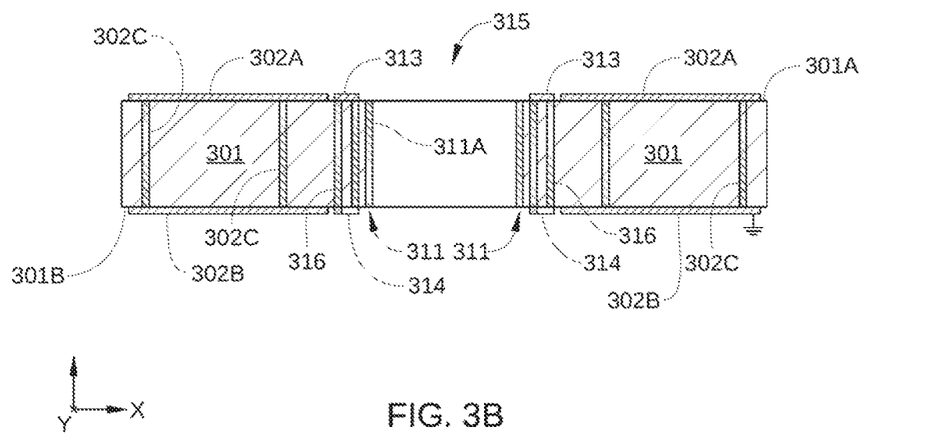
FIG. 3B is a schematic cross-sectional view of the V/I sensor in the RF plasma processing system in FIG. 1, taken at section A-A in FIG. 3A.

FIG. 3A is a schematic plan view of V/I sensor 152, according to various embodiments of the disclosure. FIG. 3B is a schematic cross-sectional view of V/I sensor 152 taken at section A-A in FIG. 3A. V/I sensor 152 is configured to accurately measure RF current and voltage in a high-temperature environment, such as a location proximate or in contact with plasma processing chamber 120 during a high-temperature PECVD process. In the embodiment illustrated in FIGS. 3A and 3B, V/I sensor 152 is configured to measure RF current and voltage in metal rod 242 and conductive leads 161 and 162. In one embodiment, V/I sensor 152 is configured to measure RF voltage and current provided at a distal end of the metal rod 242 and distal ends of the conductive leads 161 and 162. In some embodiments, the V/I sensor 152 includes a planar body 301 with a first V/I probe 310, a second V/I probe 320, a third V/I probe 330 and a ground plane 302 that surrounds and electrically isolates the first V/I probe 310, the second V/I probe 320, and the third V/I probe 330 from each other.

Planar body 301 is comprised of a non-organic containing, electrically insulative material, such as a ceramic, a mica, ferrite, or similar material. For example, suitable ceramic materials include aluminum oxide and aluminum nitride. The aforementioned non-organic, electrically insulative materials are highly temperature resistant compared to organic substrates that are commonly employed in conventional V/I sensors, such as FR-4. Consequently, planar body 301 and V/I sensor 152 are compatible with being disposed in direct contact with an atmospheric or outer surface of plasma processing chamber 120, and/or with being mounted in close proximity to an atmospheric or outer surface of plasma processing chamber 120. As a result, V/I sensor 152 can be located proximate processing region 246 of plasma processing chamber 120, such as within a filter box housing for filter 170, or coupled to or mounted on bottom 204. However, in some moderate temperature applications, the planar body 301 may be formed from a polyimide, such as Kapton®.

First V/I probe 310 includes a voltage pickup 311 and a current pickup 312, each of which is disposed around a measurement opening 315. Measurement opening 315 is configured to accommodate a conductive structure suitable for transmitting RF power, such as a conductor of transmission lines 142 or metal rod 242, which provide RF power to the embedded electrode within the susceptor 208. Thus, V/I probe 310 is configured to provide accurate voltage and current measurements of RF power being transmitted to plasma processing chamber 120 at a location proximate plasma processing chamber 120.

Figure 4A:
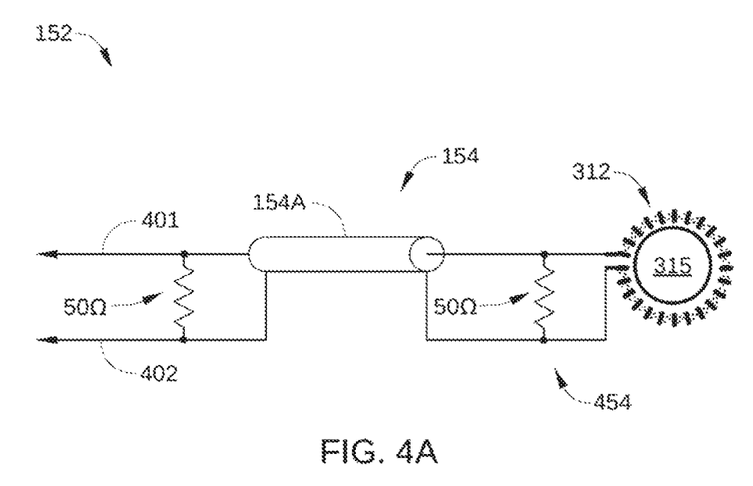
FIGS. 4A and 4B are functional schematic diagrams of a V/I probe of the V/I sensor in FIGS. 3A and 3B, according to various embodiments of the disclosure.
Figure 4B:
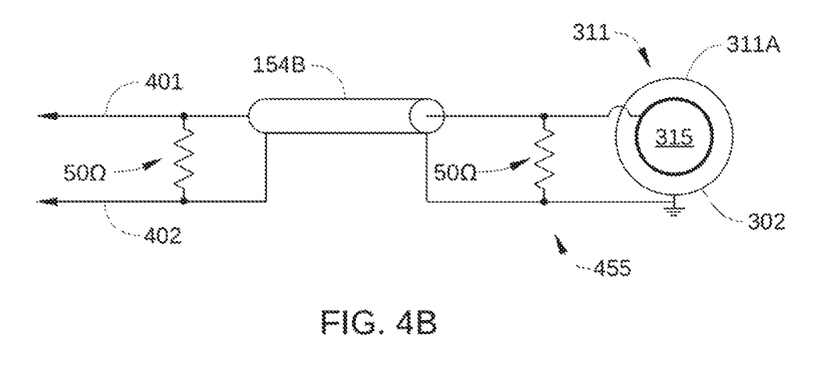

Voltage pickup 311 illustrated in FIG. 4B is configured to generate a voltage signal induced by RF power passing through measurement opening 315 formed in the planar body 301, for example via transmission lines 142 or metal rod 242. The voltage signal generated by voltage pickup 311 is substantially proportional to the voltage of the RF power passing through a portion of a conductive element that is positioned within the measurement opening 315. In some embodiments, voltage pickup 311 is configured as a conductive ring 311A, which is disposed around or formed on a surface of the measurement opening 315. The conductive ring 311A is typically surrounded by a grounded element 302. The conductive ring 311A and the grounded element 302 are both connected within an electrical circuit, such as RF voltage measurement circuit 455 illustrated in FIG. 4B, and are used together to measure the voltage of the RF power passing through a portion of the RF conductive element positioned within the measurement opening 315. The grounded element 302 generally includes one or more grounded layers 302A and 302B which are disposed on or within a surface of the V/I sensor 152 and are electrically coupled together by a plurality of interconnecting vias 302C. The one or more grounded layers 302A and 302B and plurality of interconnecting vias 302C may be formed from a conductive material (e.g., metals containing Al, Ag, Au, Mo, Sn, or Cu) and are used to electrically shield the first V/I probe 310, the second V/I probe 320, and the third V/I probe 330 from each other and from other external components. In some configurations, a plurality of interconnecting vias 302C are positioned around each of the V/I probes 310, 320 and 330 to form a shield that will minimize cross-talk between the components within each of the V/I probes. In some embodiments, the grounded element 302 can be connected to an outer shield conductor 402 of a coaxial transmission lines (not shown), such as a signal leads 154.

Current pickup 312 illustrated in FIG. 4A is configured to generate a voltage signal induced by RF power passing through a portion of a conductive element that is positioned within the measurement opening 315 by use of an electrical circuit, such as RF current measurement circuit 454 illustrated in FIG. 4A. The voltage signal induced by the magnetic field flux is induced in the current pickup 312, and is substantially proportional to the RF current passing through the portion of a conductive element that is positioned within the measurement opening 315. In some embodiments, current pickup 312 is configured as a toroidal-shaped coil, or a close approximation thereto. For example, in the embodiment illustrated in FIGS. 3A and 3B, current pickup 312 includes substantially planar circuit traces 313 on a top surface 301A of planar body 301, substantially planar circuit traces 314 on a bottom surface 301B of planar body 301, and conductive vias 316 formed through planar body 301. Each conductive via 316 connects a circuit trace 313 with a corresponding circuit trace 314, so that together, circuit traces 313, circuit traces 314, and conductive vias 316 that are serially interconnected to form a form a continuous conductive loop structure.

It is noted that the configuration of V/I sensor 152 illustrated in FIGS. 3A and 3B minimizes or otherwise reduces cross-talk between voltage pickup 311 and current pickup 312. Specifically, because voltage pickup 311 and current pickup 312 are positioned in a single plane, i.e., a plane defined by planar body 301 (e.g., X-Y plane), and because this plane is orthogonal to the direction of RF power transmission passing through measurement opening 315, RF voltage in the transmission lines disposed in measurement opening 315 induces little or no voltage in current pickup 312, and RF current flowing in the transmission lines disposed in measurement opening 315 induces little or no voltage in voltage pickup 311. Consequently, it is believed that the transmission lines voltage measurement and current measurement can be considered to be mutually exclusive of each other, and thus there is very little cross-talk between these sensing elements. That is, there are no significant measurement errors caused by the voltage signal from voltage pickup 311 including a contribution from RF current passing through measurement opening 315, and there are no significant measurement errors caused by the current signal from current pickup 312 including a contribution from RF voltage passing through measurement opening 315. Thus, the product of the measured voltage, the measured current, and the cosine of the phase difference between voltage pickup 311 and current pickup 312 is substantially proportional to the instantaneous transmission lines power at the point of the measurements. In some embodiments, the size of the voltage pickup 311 and current pickup 312 in the V/I probe 310 is sized proportionally to the size or cross-sectional area of the portion of the conductive element passing through the opening 315 formed therein or the generated fields passing the opening 315 formed therein.

Second V/I probe 320 and third V/I probe 330 may be substantially similar in configuration and operation to first V/I probe 310, and are included in V/I sensor 152 to provide voltage and current measurements for additional RF transmission lines associated with plasma processing chamber 120, such as conductive leads 161 and 162. It is noted that conductive leads 161 and 162 are not intended as RF transmission lines, but nonetheless may act as such in some embodiments of plasma processing chamber 120.

Second V/I probe 320 includes a voltage pickup 321 and a current pickup 322, each of which is disposed around a measurement opening 325. Measurement opening 325 is configured to accommodate a particular RF conductive lead associated with plasma processing chamber 120 that is not coupled between an RF generating source and a ground that is coupled to the plasma processing chamber 120, such as conductive lead 161. In some embodiments, the size of the voltage pickup 321 and current pickup 322 in the V/I probe 320 is sized proportionally to the size or cross-sectional area of the portion of the conductive element passing through the measurement opening 325 formed therein or the generated fields passing the measurement opening 325 formed therein.

Similarly, third V/I probe 330 includes a voltage pickup 331 and a current pickup 332, each of which is disposed around a measurement opening 335. Measurement opening 335 is configured to accommodate another RF conductive lead associated with plasma processing chamber 120 that is not coupled between an RF generating source and a ground that is coupled to the plasma processing chamber, such as conductive lead 162. In some embodiments, the size of the voltage pickup 331 and current pickup 332 in the V/I probe 330 is sized proportionally to the size or cross-sectional area of the portion of the conductive element passing through the measurement opening 335 formed therein or the generated fields passing the measurement opening 335 formed therein. Because second V/I probe 320 and third V/I probe 330 enable measurement of RF power loss through conductive leads 161 and 162, the actual RF power coupled to processing region 246 can be more accurately determined than by merely measuring RF power delivered to the plasma processing chamber 120 via an upstream portion of the metal rod 242 or transmission lines 142. Therefore, chamber-to-chamber variation in the efficiency of filter 170 can be detected, quantified, and compensated for by use of the various V/I probes and chamber RF matching elements.

FIGS. 4A and 4B are functional schematic diagrams of first V/I probe 310 of V/I sensor 152, according to various embodiments of the disclosure. As shown, a signal lead 154A of the signal leads 154 (FIG. 1) is coupled to current pickup 312 and signal lead 154B of the signal leads 154 is coupled to voltage pickup 311. In some embodiments, each of these signal leads 154A and 154B are configured as part of one or more coaxial cables that have a 50 ohm resistance between a center conductor 401 and an outer shield conductor 402.

In some embodiments, for optimal or otherwise improved operation of plasma processing chamber 120, each V/I sensor associated therewith can be calibrated. In such embodiments, a particular signal voltage generated by the voltage pickup of the V/I sensor can be precisely correlated to a particular known RF voltage passing through the measurement opening of the V/I sensor. Similarly, a particular signal voltage generated by the current pickup 312 of the V/I sensor can be precisely correlated to a particular known RF current passing through the measurement opening of the V/I sensor. In this way, a calibration coefficient can be generated for the voltage pickup and another calibration coefficient can be generated for the current pickup 312. In subsequent operation, signal voltages generated by the voltage pickup and multiplied by the appropriate calibration coefficient can precisely indicate what (e.g., peak or RMS) RF voltage is passing through the measurement opening at any instant in time. Similarly, signal voltages generated by the current pickup 312 and multiplied by the appropriate calibration coefficient can precisely indicate what (e.g., peak or RMS) RF current is passing through the measurement opening at any instant in time. One such embodiment is described below in conjunction with FIG. 5.

Figure 5:
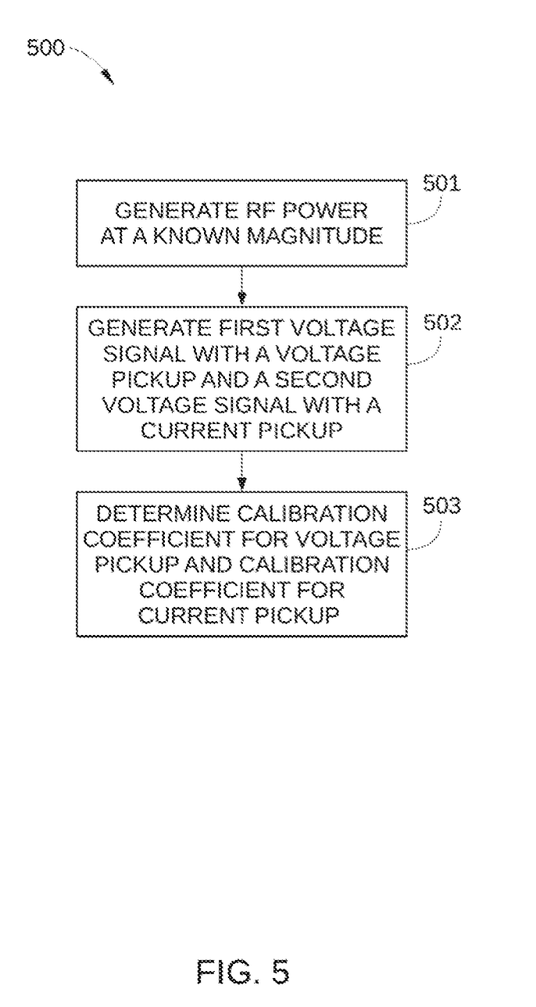
FIG. 5 sets forth a flow chart of process steps for calibrating a V/I sensor, according to various embodiments of the disclosure.

FIG. 5 sets forth a flow chart of process for calibrating a V/I sensor, according to various embodiments of the disclosure. Although the process is described in conjunction with RF plasma system 100 in FIGS. 1-4, persons skilled in the art will understand that the process may be performed with other types of RF plasma systems. The control algorithms for the method 500 reside in controller 150, the machine-compatible controller configured to control the operation of plasma processing chamber 120, or in a separate computing device coupled to RF plasma system 100 during the calibration process. These control algorithms may be implemented in whole or in part as software- or firmware-implemented logic, and/or as hardware-implemented logic circuits.

Prior to the process, a suitable RF generator is coupled to a dummy load of a known impedance, via an RF match and a suitable transmission lines of a known impedance. More specifically, the RF generator, the dummy load, and the RF match are selected to form a matched RF system, i.e., an RF system with no reflection. For example, in one embodiment, second RF generator 140 is coupled to a 50 ohm dummy load via second RF match 141 and transmission lines 142. In addition, prior to the process, the transmission lines is fed through a measurement opening of the V/I sensor to be calibrated, such as V/I sensor 152.

A method 500 begins at block 501, in which RF power is generated by second RF generator 140 at a particular RF frequency. For example, in one embodiment, second RF generator 140 generates 2500W at 27 MHz. In some embodiments, the magnitude of RF power generated in block 501 is equal to a maximum or RMS RF power expected to be employed by second RF generator 140 at the particular frequency.

At block 502, the V/I probe through which transmission 142 is fed, for example first V/I probe 310, generates a first voltage signal and a second voltage signal. Voltage pickup 311 generates the first voltage signal, which is proportional to the RF voltage found at the measurement opening 315 of first V/I probe 310. Current pickup 312 generates the second voltage signal, which is proportional to the RF current passing through measurement opening 315 of first V/I probe 310. The control circuitry 150 may then store these received measurement signals in memory.

At block 503, a calibration coefficient is determined for voltage pickup 311 based on the first voltage signal and the known RF voltage passing through measurement opening 315. It is noted that because there is no reflection in the matched RF system employed in method 500, the RF voltage equals the square root of the product of RF power and resistance of the system. Because both RF power and resistance of the system are known, the RF voltage is known. Therefore, after completing blocks 501-503 at least twice a V/I probe voltage versus the known magnitude of the RF voltage curve can be formed. Since the calibration curve will be linear and the intercept will be at zero volts, the coefficient will equal the slope of the formed curve, which is then be used as the calibration coefficient for the V/I probe voltage.

Also at block 503, a calibration coefficient is determined for current pickup 312 based on the second voltage signal and the known RF current passing through measurement opening 315. Because there is no reflection in the matched RF system employed in method 500, the RF current is also known, since current equals the square root of the ratio of RF power to resistance of the system. Because both RF power and resistance of the system are known, the RF current is known. Therefore, after completing blocks 501-503 at least twice a V/I probe current measurement (e.g., voltage signal) versus the known magnitude of the RF current curve can be formed. Since the calibration curve will be linear and the intercept will be at zero volts, the coefficient will equal the slope of the formed curve, which is then be used as the calibration coefficient for the V/I probe current measurement.

In some embodiment, the determined calibration coefficient for the voltage pickup 311 and/or the calibration coefficient for current pickup 312 for each V/I probe are stored within memory of the control circuitry 150 for use by portions of the control circuitry to adjust the measured RF current and voltage values by the V/I probes that are then used by the RF matching elements and/or RF power supply elements used in the processing chamber.

In some embodiments, an RF generator may be employed in an RF plasma system to provide mixed operating frequencies. For example, in some situations, two RF frequencies simultaneously drive the PECVD plasma to control plasma density and ion energy proximate a substrate 210 being processed. Also, pulsing operation may be employed to optimize certain film properties. In either case, when more than one frequency is present in an RF system, the signals generated by a current pickup 312 and a voltage pickup of a V/I sensor are typically fed through a band-pass filter (not shown) at each of the operating frequencies before reaching magnitude and phase detection circuitry. Insertion of such band-pass filters can introduce magnitude differences (attenuation) and phase differences between the signal generated by the current pickup 312 and the signal generated by the voltage pickup that can then be used to adjust the RF power provided by each of the RF generators and/or adjust the RF match parameters associated with each RF source's respective RF matching element(s).

According to some embodiments, when an RF generator is employed in an RF plasma system to provide mixed operating frequencies, the calibration process of method 500 may be employed at different RF power levels at each of the RF frequencies used in the processing chamber to produce accurate calibration coefficients for each of the driven RF frequencies. Specifically, the calibration process of method 500 may be employed at each operating frequency, to generate calibration coefficients for each operating frequency, thereby enabling calibration for attenuation of the generated signal(s) caused by the above-described band-pass filters. In addition, because the RF system employed in method 500 is a matched RF system with no reflection, any phase difference detected between the first voltage signal and the second voltage signal is actually the phase offset of the RF system that is detected by the measurement circuitry caused by the band-pass filter included therein. For multiple frequency operation of an RF system, a different system phase offset is generally employed at each driven RF frequency, and each such phase offset being determined in a different implementation of method 500. Therefore, the phase difference measured in method 500 at a particular frequency can be considered a system phase offset that may be employed for that particular operating frequency for use in the correction of the detected RF power parameters by the V/I probes that can then be used to control the RF power provided by each of the RF generators and/or adjust the RF match parameters associated with each RF source's respective RF matching element(s).

Figure 6:
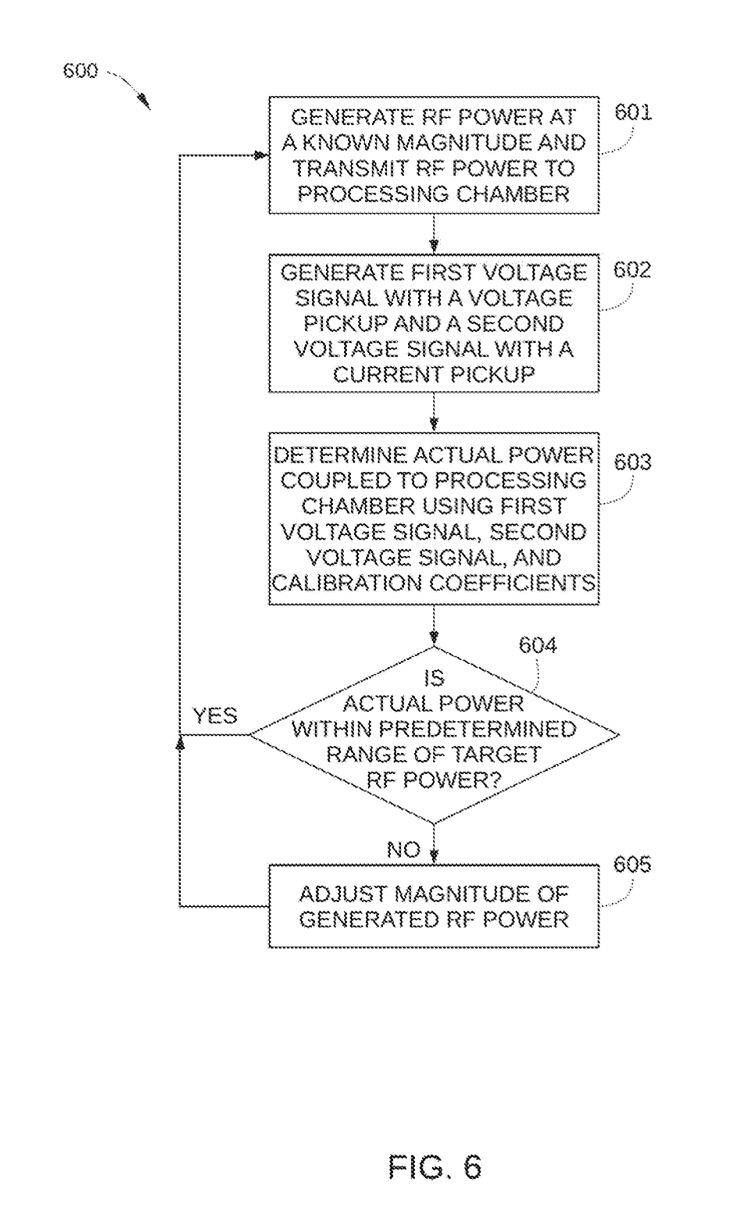
FIG. 6 sets forth a flow chart of process steps for controlling RF power applied to a plasma processing chamber, according to various embodiments of the disclosure.

FIG. 6 sets forth a flow chart of a process for controlling RF power applied to a plasma processing chamber 120, according to various embodiments of the disclosure. Although the process is described in conjunction with RF plasma system 100 in FIGS. 1-4, persons skilled in the art will understand that the process may be performed with other types of RF plasma systems. The control algorithms for the method reside in controller 150, or the machine-compatible control circuitry configured to control the operation of plasma processing chamber 120. These control algorithms may be implemented in whole or in part as software- or firmware-implemented logic, and/or as hardware-implemented logic circuits.

Prior to the process, suitable calibration coefficients are determined, for example via method 500, for each V/I probe associated with RF plasma system 100. For example, for V/I sensor 152, a suitable calibration coefficient is determined for each of voltage pickup 311, current pickup 312, voltage pickup 321, current pickup 322, voltage pickup 331, and current pickup 332. In addition, in embodiments in which second RF generator 140 is configured to generate a mixed frequency, a system phase offset from measurement circuitry of RF plasma system 100 is also determined for each frequency.

A method 600 begins at block 601, in which RF power is generated by second RF generator 140 at a particular RF frequency and output magnitude. The magnitude of RF power generated at block 601 is intended to result in a target RF power being coupled to processing region 246. Generally, the target RF power is associated with a particular process being run in plasma processing chamber 120. Thus, for a different process, a different target RF power may be employed at block 601.

At block 602, V/I sensor 152 generates at least a first voltage signal and a second voltage signal, where voltage pickup 311 generates the first voltage signal, and current pickup 312 generates the second voltage signal. The first voltage signal is proportional to the RF voltage passing through measurement opening 315 of V/I probe 310, and the second voltage signal is proportional to the RF current passing through measurement opening 315 of V/I probe 310. In embodiments in which V/I sensor 152 includes multiple probes, V/I sensor generates additional voltage signals, such as voltage signals that measure RF voltage and current associated with conductive leads 161 and 162.

At block 603, actual RF power delivered to processing region 246 in plasma processing chamber 120 is determined. In some embodiments, determining the actual RF power delivered includes applying a first calibration coefficient to the first voltage signal and a second calibration coefficient to the second voltage signal. As noted above, the first and second calibration coefficients are typically determined in a previously performed calibration process, such as method 500.

During the process of determining the actual RF power delivered to processing region 246, the control circuitry 150 may retrieve the first calibration coefficient and the second calibration coefficient from memory, and then multiply the appropriate calibration coefficient with the appropriate measure signal value collected from the appropriate V/I probe to determine a corrected measurement signal value that can then be used to control the RF power provided by each of the RF generators and/or adjust the RF match parameters associated with each RF source's respective RF matching element(s). For example, in some embodiments, the first voltage signal is multiplied by the first calibration coefficient to generate a measured voltage value that accurately indicates the actual voltage passing through V/I sensor 152, and the second voltage signal is multiplied by the second calibration coefficient to generate a measured current value that accurately indicates the actual current passing through V/I sensor 152. The actual RF power coupled to processing region 246 can then be computed based on the measured voltage value and the measured current value. The actual RF power that is coupled to processing region 246 can then be used by software running within the control circuitry 150 to more accurately control a process that is being performed in the processing chamber and/or be displayed on graphical user interface (e.g., monitor or display) that is coupled to the control circuitry 150 and accessible to a user.

In some embodiments, the actual RF power coupled to processing region 246 is further based on a measured phase difference between the measured voltage value and the measured current value. Specifically, in such embodiments, the instantaneous transmission lines power at the point of the measurements is the product of the measured voltage value, the measured current value, and the cosine of the measured phase difference between voltage pickup 311 and current pickup 312. The measured phase difference can then be used by software running within the control circuitry 150 to more accurately control the RF related processes that are being performed in the processing chamber and/or be displayed on graphical user interface (e.g., monitor or display) that is coupled to the control circuitry 150 and accessible to a user.

In embodiments in which a mixed frequency is generated by second RF generator 140, a previously determined system phase offset is first subtracted from the measured phase difference between the first voltage signal (from voltage pickup 311) and the second voltage signal (from current pickup 312). In this way, the actual phase difference between voltage pickup 311 and current pickup 312 can be determined prior to calculating the actual RF power coupled to processing region 246 at block 603.

In some embodiments, the actual RF power coupled to processing region 246 is also based on lost RF power that is not delivered to processing region 245. For example, in such embodiments, the actual RF power delivered to processing region 246 is also based on RF power measured in conductive leads 161 and 162.

At block 604, the determination is made whether the actual RF power coupled to processing region 246 is within a predetermined range of the target RF power being coupled to processing region 246. If yes, the current output magnitude remains unchanged, and method 600 proceeds to block 601; if no, 600 proceeds to block 605.

In block 605, the current output magnitude is adjusted so that the actual RF power being coupled to processing region 246 is closer or equal to the target RF power being coupled to processing region 246. Method 600 then proceeds back to block 601.

Implementation of method 600 enables improved measurement and control of RF voltage, current, phase, and coupled RF power in high-temperature environments. Because RF voltage and current can be measured at a location proximate the processing region of a plasma processing chamber 120, coupled RF power can be more accurately determined, thereby improving performance of the plasma processing chamber 120 and reducing chamber-to-chamber variation of a plasma process.

In some embodiments disclosed herein, a V/I sensor includes a planar body 301 comprised of a non-organic, electrically insulative material, a measurement opening formed in the planar body 301, a voltage pickup disposed around the measurement opening, and a current pickup disposed around the measurement opening. Because of the planar configuration and material composition of the V/I sensor, the V/I sensor can be disposed proximate to or even in contact with a high-temperature surface of a plasma processing chamber 120. As noted above, in some embodiments, a voltage signal, which is proportional to the RF voltage passing through the V/I sensor, is derived from the voltage pickup portion of the V/I sensor and a voltage signal, which is proportional to the RF current passing through the V/I sensor, is derived from the current pickup portion of the V/I sensor, which due to the nature of sensed signals creates no significant measurement interaction between sensors and thus minimizes errors induced in the measured values. Therefore, based on one or more of these factors, the RF voltage and current measurements provided by one or more of the embodiments disclosed herein are generally more accurate than conventionally placed V/I sensors.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

While the foregoing is directed to embodiments of the present disclosure, other and further embodiments of the disclosure may be devised without departing from the basic scope thereof, and the scope thereof is determined by the claims that follow.

The invention claimed is:

1. A plasma processing chamber, comprising:
 a chamber body;
 a discharge electrode disposed within the chamber body;
 a voltage-current sensor that is positioned within a region of the chamber body that is at least partially isolated from external noise sources by one or more grounded or shielded process chamber elements and comprises a planar body comprised of a non-organic, electrically insulative material, wherein the voltage-current sensor includes a first voltage measurement circuit and a first current measurement circuit; and
 a radio-frequency transmission line that is fed through a measurement opening of the voltage-current sensor and electrically couples radio frequency power to the discharge electrode.

2. The plasma processing chamber of claim 1, wherein the discharge electrode comprises a substrate support or a gas distribution plate.

3. The plasma processing chamber of claim 1, wherein the voltage-current sensor further comprises:
 a conductive ring disposed around the measurement opening, wherein the conductive ring is electrically coupled to the first voltage measurement circuit; and
 a toroidal coil embedded in the planar body and disposed around the measurement opening, wherein the toroidal coil is electrically coupled to the first current measurement circuit.

4. The plasma processing chamber of claim 3, wherein the discharge electrode comprises a substrate support that includes a heating coil and an electrical lead that is electrically coupled to the heating coil and the voltage-current sensor further comprises:

an additional measurement opening formed in the planar body;

an additional conductive ring disposed around the additional measurement opening, wherein the additional conductive ring is electrically coupled to a second voltage measurement circuit; and an additional toroidal coil embedded in the planar body and disposed around the additional measurement opening, wherein the additional toroidal coil is electrically coupled to a second current measurement circuit, wherein the electrical lead is fed through the additional measurement opening.

5. The plasma processing chamber of claim 4, wherein the plasma processing chamber further comprises a radio-frequency filter that is electrically positioned between the substrate support and a heater power supply for the heating coil.

6. The plasma processing chamber of claim 1, wherein the discharge electrode comprises a substrate support that is coupled to the radio-frequency transmission line at a connection point, and wherein the voltage-current sensor is positioned at or proximate to the connection point.

7. The plasma processing chamber of claim 6, wherein the connection point corresponds to a point along a standing wave in the radio frequency power that is electrically coupled to the discharge electrode, the standing wave having a minimum amplitude at the point.

8. The plasma processing chamber of claim 1, wherein the voltage-current sensor is positioned in a shaft.

\* \* \* \* \*